United States Patent
Sugai

[11] Patent Number: 5,691,650
[45] Date of Patent: Nov. 25, 1997

[54] APPARATUS FOR COUPLING A SEMICONDUCTOR DEVICE WITH A TESTER

[75] Inventor: Maureen Sugai, Phoenix, Ariz.

[73] Assignee: Motorola, Inc., Schaumburg

[21] Appl. No.: 759,324

[22] Filed: Dec. 2, 1996

Related U.S. Application Data

[60] Continuation of Ser. No. 435,025, May 4, 1995, abandoned, which is a division of Ser. No. 47,901, Apr. 19, 1993, Pat. No. 5,440,231.

[51] Int. Cl.$^6$ .............................. G01R 31/02; G01R 1/073
[52] U.S. Cl. ................................................. 324/755; 324/762
[58] Field of Search .................................... 324/755, 754, 324/762; 439/68, 71, 72, 73, 525

[56] References Cited

U.S. PATENT DOCUMENTS

| | | | |
|---|---|---|---|
| 4,047,780 | 9/1977 | Cedrone | 324/754 |
| 4,330,683 | 5/1982 | Parker | 439/68 |
| 4,657,324 | 4/1987 | Kamono et al. | 439/68 |
| 4,683,423 | 7/1987 | Morton | 324/755 |
| 4,713,611 | 12/1987 | Solstad et al. | 324/760 |
| 4,839,587 | 6/1989 | Flatley et al. | 324/761 |
| 4,866,374 | 9/1989 | Cedrone | 324/537 |
| 4,956,605 | 9/1990 | Bickford et al. | 324/760 |
| 5,008,615 | 4/1991 | Littlebury | 324/754 |
| 5,054,188 | 10/1991 | Sabado | 29/564.6 |
| 5,086,269 | 2/1992 | Nobi | 324/760 |
| 5,177,436 | 1/1993 | Lee | 324/755 |
| 5,189,363 | 2/1993 | Bregman et al. | 324/754 |
| 5,226,823 | 7/1993 | Johnson | 439/71 |

FOREIGN PATENT DOCUMENTS

| | | |
|---|---|---|
| 91302704 | 11/1991 | European Pat. Off. . |
| 9004918 | 3/1991 | Germany . |

*Primary Examiner*—Ernest F. Karlsen
*Attorney, Agent, or Firm*—Rennie William Dover

[57] ABSTRACT

A method for making and using a test fixture (10) for testing a packaged semiconductor device (44). The test fixture (10) includes a nonconductive housing (11) and a contactor assembly (30). The contactor assembly (30) has a contactor lead (31) and is removable from the housing (11). The contactor assembly (30) is mounted to the housing (11) such that the contactor lead (31) becomes interdigitated between upper cantilever structures (20) and lower cantilever structures (21). The test fixture (10) is coupled to a tester (46) which is between a first tool set (41) and a second tool set (42) of a trim and form apparatus (40). The packaged semiconductor device (44) is placed in contact with the test fixture (10) and tested.

20 Claims, 2 Drawing Sheets

APPARATUS FOR COUPLING A SEMICONDUCTOR DEVICE WITH A TESTER

This application is a continuation of prior application Ser. No. 08/435,025, filed May 4, 1995, now abandoned, which is a application of prior application Ser. No. 08/047,901 filed on Apr. 19, 1993, now U.S. Pat. No. 5,440,231.

BACKGROUND OF THE INVENTION

The present invention relates, in general, to testing semiconductor devices and, more particularly, to testing non-singulated semiconductor devices which are attached to a leadframe.

After fabrication, semiconductor devices are usually placed in packages for protection from mechanical stresses. The steps used in packaging semiconductor devices generally include mounting a plurality of semiconductor devices to a leadframe, forming wire bonds between the semiconductor devices and the leadframe, and encapsulating the semiconductor devices within a molding compound. Subsequently, the leadframe is trimmed, formed, and separated, thereby producing individual or singulated packaged semiconductor devices.

Semiconductor devices mounted to a leadframe may be electrically tested after the trimming step because they are electrically isolated from one another. However, most semiconductor device manufacturers do not test the packaged semiconductor devices until after they have been singulated. Electrically testing the packaged semiconductor devices prior to singulation is tricky because the leadframe leads are in a very fragile and vulnerable position and may, therefore, be easily damaged. Any damage to the leads amounts to destroying the packaged semiconductor device. The probability of damaging the leads is reduced by performing the steps of trimming, forming, and singulation sequentially using the same apparatus.

Littlebury, in U.S. Pat. No. 5,008,615 entitled "Means and Method for Testing Integrated Circuits Attached to a Leadframe" discloses a means and method for testing integrated circuits after they have been encapsulated but before they have been singulated. In particular, the technique of Littlebury relies on testing the encapsulated semiconductor devices after the leadframe leads have been partially "formed".

Accordingly, it would be advantageous to have a method for electrically testing packaged semiconductor devices prior to singulation. More particularly, the method should test the encapsulated semiconductor devices before the leads are "formed". Further, it would be advantageous that the method reduce cycle time and testing costs. The method should also reduce the number of times the singulated packaged semiconductor devices are handled.

SUMMARY OF THE INVENTION

Briefly stated, the present invention provides a method and an apparatus for coupling a semiconductor device with a tester and subsequently testing the semiconductor device. In one aspect of the present invention, a test fixture is provided wherein the test fixture comprises a housing having at least one side. The at least one side includes a recess having a mouth and a backwall. At least two upper cantilever structures extend from an upper portion of the backwall and at least two lower cantilever structures extend from a lower portion of the backwall. The test fixture further includes a contactor assembly having at least one lead which is positioned between the at least two upper and lower cantilever structures when the contactor assembly is mounted to the housing.

In another aspect of the present invention, a method of testing semiconductor devices is provided by mating the test fixture to a tester. A non-singulated packaged semiconductor device is placed on the test fixture and electrically tested.

DETAILED DESCRIPTION OF THE DRAWINGS

Figure 1:
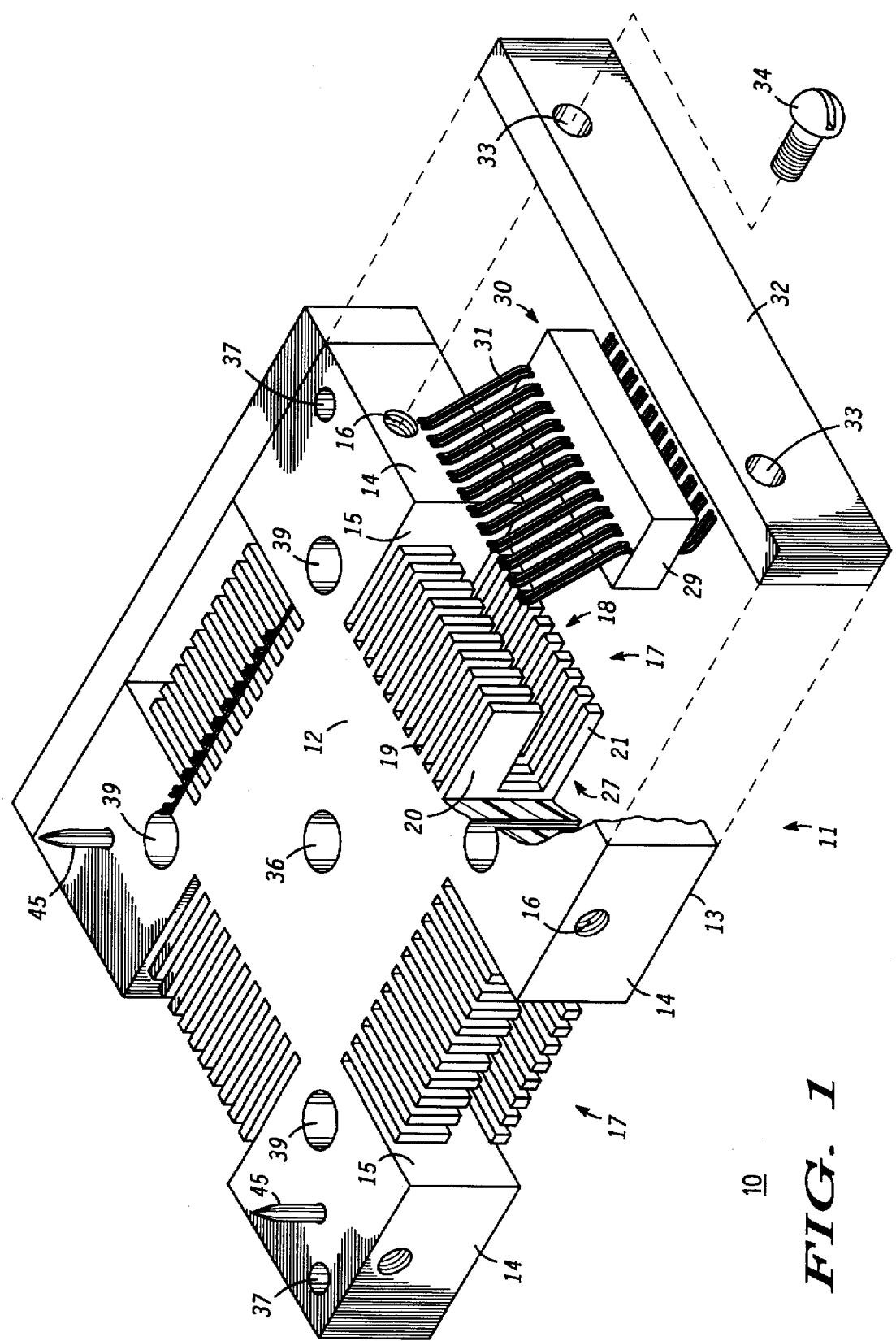
FIG. 1 illustrates a cut-away exploded isometric view of a test fixture in accordance with the present invention.

FIG. 1 illustrates a cut-away exploded isometric view of an embodiment of a test fixture 10 for mating with leadframe leads in accordance with the present invention. Test fixture 10 includes a rectangular shaped electrically nonconductive housing or base 11 having a top surface 12, a bottom surface 13, and four side surfaces 14. A cavity or recess 17 extends from each side surface 14 into nonconductive housing 11 wherein each cavity 17 has a pair of sidewalls 15, a mouth 18, and a backwall 19. Although test fixture 10 is described as having a rectangular shape with four cavities 17, it shall be understood that the shape of test fixture 10 and the number of cavities 17 extending from side surface 14 are not limitations of the present invention. Moreover, the following description of cavity 17 applies to each side surface 14 having a cavity 17.

Each pair of sidewalls 15 extends from a corresponding side surface 14 into nonconductive housing 11. The pair of sidewalls 15 are substantially parallel to one another, substantially perpendicular to the corresponding side surface 14 from which they extend, and are spaced apart from corners formed by the intersection of sidewalls 14. Each pair of sidewalls 15 is connected via backwall 19, wherein backwall 19 is substantially perpendicular to said pair of sidewalls 15 and substantially parallel to the corresponding side surface 14. Between each pair of sidewalls 15 and said corners is a threaded screw hole 16.

In addition, each cavity 17 has an upper plurality of protrusions 20 which form upper cantilever structures and a lower plurality of protrusions 21 which form lower cantilever structures. Cantilevers 20 and 21 are connected to and extend from an upper and a lower portion, respectively, of backwall 19 toward mouth 18. Further, they are substantially parallel to and spaced apart from one another, substantially perpendicular to backwall 19, and have approximately the same length and width. Although cantilevers 20 and 21 have approximately the same length and width, cantilever 20 is thicker than cantilever 21. The greater thickness of cantilever 20 is advantageous for contactor assembly 30 as will be explained subsequently. The length of cantilevers 20 and 21 is less than the distance that cavity 17 extends into nonconductive housing 11 such that cantilevers 20 and 21 do not extend past sides 14. Further, cantilevers 20 and 21 are vertically spaced apart thereby forming a gap 27 between them.

Test fixture 10 has a detachable contactor assembly 30 which includes a case 29 having a top side, a bottom side, and a plurality of contactor leads 31 extending therefrom. Although only a single detachable contactor assembly 30 is shown in FIG. 1, it shall be understood that test fixture 10 may have more than one detachable contactor assembly.

Figure 2:
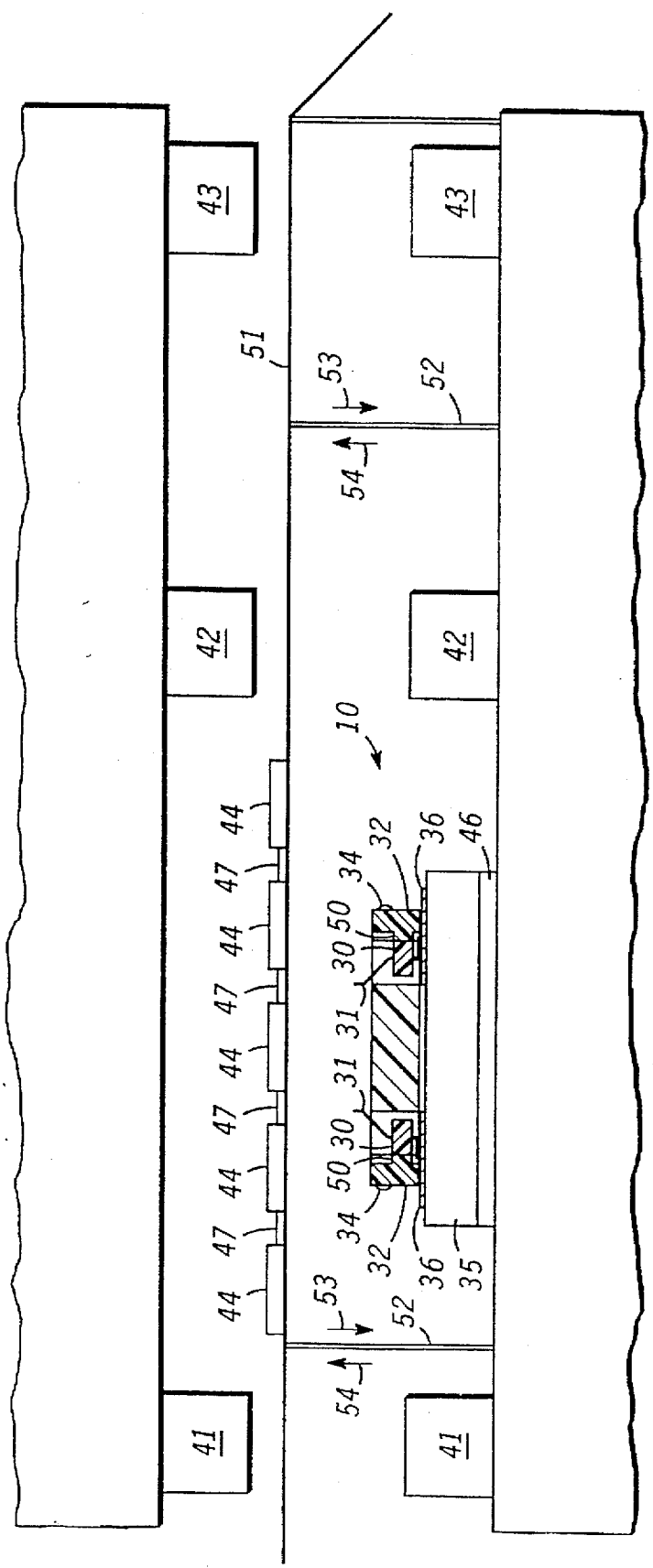
FIG. 2 illustrates a trim and form tool having a tester which uses the test fixture of FIG. 1.

Each contactor lead 31 is a unitary lead having a first end which extends or projects from the top side and a second end which extends or projects from the bottom side of contactor assembly 30. The first end is adapted to mate with a leadframe lead extending from a packaged semiconductor device 44 (FIG. 2) and the second end is adapted to mate with conductive traces (36) or contact pads on a printed circuit board 35 (FIG. 2). It is desirable that contactor leads 31 be molded in or through case 29. Thus, contactor assembly 30 may be a molded structure wherein contactor leads 31 are molded therein. Contactor leads 31 are illustrated in FIG. 1 as being elongated rectangular structures, however it shall be understood that contactor leads 31 may have any suitable shape including, for example, having an elongated cylindrical shape. Preferably, contactor leads 31 are made from a resilient conductor material such as a precious metal alloy comprising palladium, platinum, gold, silver, copper, and zinc and sold under the trademark "PALINEY" by J. M. Ney, or beryllium copper, or the like.

The number of contactor leads 31 and cantilevers 20 and 21 are selected in accordance with the package type in which the semiconductor device to be tested is encapsulated. For example, four contactor assemblies 30 are used for a 44 pin plastic leaded chip carrier package (PLCC). Each contactor assembly 30 is mated with a cavity 17 such that case 29 is placed between the upper and lower cantilever structures 20 and 21, respectively. Further, there is a cavity 17 present at each of the side surfaces 14 of rectangular housing 11. For testing a 44 pin PLCC, each contactor assembly 30 has twenty-two contactor leads 31 that are divided into eleven pairs wherein each pair is comprised of two contactor leads 31 that are side by side and abut one another. Thus, each pair of contactor leads 31 contacts a single pin or leadframe lead of a packaged semiconductor device. The use of two contactor leads 31 per semiconductor leadframe lead provides redundancy and increases the probability of a solid electrical connection between contactor leads 31 and the semiconductor leadframe leads.

In use, contactor assembly 30 is mated with housing 11 by inserting contactor assembly 30 into gap 27 such that the first ends of contactor leads 31 extend between upper cantilever structures 20 and the second ends of contactor leads 31 extend between lower cantilever structures 21. In other words, contactor leads 31 cooperate with cantilever structures 20 and 21 such that the first ends of contactor leads 31 become interdigitated with upper cantilever structures 20 and the second ends of contactor leads 31 become interdigitated with lower cantilever structures 21. Cantilevers 20 and 21 are also referred to as guidemembers. Making upper cantilever structure 20 thicker than lower cantilever structure 21 allows forming the first ends of contactor leads 31 with sufficient length to promote better contact between contactor leads 31 and leadframe leads (not shown). Further, the longer first ends permit additional play in contactor leads 31, which allows bending or re-forming the first ends as they become worn, thereby increasing the life of contactor leads 31.

Contactor assembly 30 is secured to nonconductive housing 11 by placing securing means 32 against side surfaces 14 such that screw holes 33 are aligned with threaded screws holes 16. Then, a screw 34 is inserted into each hole 33 and screwed into each threaded screw hole 16. Only a single screw 34 is shown to avoid cluttering FIG. 1 and to facilitate an understanding of the present invention. Securing means 32 includes a stop (reference numeral 50 of FIG. 2) extending therefrom which is inserted into gap 27 and presses against contactor assembly 30 thereby securing contactor assembly 30 in place. Other ways of fastening retainer 32 to nonconductive housing 11 are well known to those skilled in the art and include clips, snaps, adhesive materials, or the like.

To facilitate an understanding of the present invention, test fixture 10 is shown in FIG. 1 with one side as an exploded isometric view, one side having a contactor assembly 30 secured to nonconductive housing 11 via securing means 32, and two sides without contactor assemblies 30. Further, nonconductive housing 11 may have other features to facilitate the testing process such as, for example, a central aperture 36 for use with a sensor to indicate the presence of a packaged semiconductor device. Preferably, nonconductive housing 11 includes contact block locating pins (not shown) which extend from the portion of holes 37 at bottom surface 13. Contact block locating pins serve to position test fixture 10 on loadboard 35 (FIG. 2). Further, test fixture 10 includes leadframe locating pins 45 which position leadframes of non-singulated packaged semiconductor devices on test fixture 10. There may also be fastening holes 39 through which test fixture 10 is fastened or secured to a load board.

Referring now to FIG. 2, a highly simplified side view of a trim and form apparatus 40 having three tool sets is shown. Since several of the elements of test fixture 10 have been described with reference to FIG. 1, like numeral are used to designate identical or corresponding elements in FIG. 2. Further, FIG. 2 more clearly illustrates stop 50 extending from securing means 32. In addition, FIG. 2 illustrates test fixture 10 mounted to loadboard 35 and the mounting of the second ends of contactor leads 31 to conductive traces 36 of loadboard 35.

A first tool set 41 provides lead trim and dam bar removal. A second tool set 42 is a forming tool set that forms the leads into a desired shape. A third tool set 43 is a singulating apparatus that separates each packaged semiconductor device into individual units. Trim and form apparatus are well known in the art. In addition, trim and form apparatus 40 is modified to have a tester 46 between first tool set 41 and second tool set 42. Trim and form apparatus 40, in conjunction with tester 46, serves as a means for electrically testing a packaged semiconductor device. Tester 46 includes a loadboard 35 having a plurality of conductive traces 36, wherein loadboard 35 may be attached to tester 46 with a set of screws (not shown). Other methods for attaching loadboard 35 to tester 46 include, for example, bonding, clipping, or clamping loadboard 35 to tester 46. Housing 11 is mounted to loadboard 35 of tester 46.

Although tester 46 is shown in FIG. 2 as being mounted in trim and form apparatus 40, it shall be understood that FIG. 2 is a highly simplified representation of trim and form apparatus 40 and tester 46 and there are many other configurations for trim and form apparatus 40 and tester 46. For example, tester 46 may be configured such that loadboard 35 is coupled to the test circuitry of tester 46 via a cable. Thus, loadboard 35 is mounted to trim and form apparatus 40, however the test circuitry to which loadboard 35 is coupled is located external to and detached from trim and form apparatus 40. Accordingly, the configuration of trim and form apparatus 40 and tester 46 is not a limitation of the present invention.

In operation, a plurality of non-singulated packaged semiconductor devices 44 are transported into trim and form apparatus 40 via a transport track 51, wherein packaged semiconductor devices 44 are connected to each other by portions 47 of the leadframe. Packaged semiconductor devices 44 are transported to first tool set 41 wherein the leads are trimmed and the dam bar is removed. Although the plurality of semiconductor devices 44 are connected to one another by the leadframe portions 47, it shall be understood that they are electrically isolated from one another.

Subsequently, trim and form apparatus 40 transports non-singulated packaged semiconductor devices 44 via transport track 51 to tester 46, and an elevating means 52 lowers a packaged semiconductor device 44 onto test fixture 10 (indicated by arrows 53). Thus, non-singulated packaged semiconductor device 44 is placed on test fixture 10 such that it is placed in contact with contactor assembly 30. More particularly, leadframe leads (not shown) are brought into contact with the first ends of contactor leads 31 and tester 46 tests the packaged semiconductor device 44 that is in contact with contactor leads 31. Then, elevating means 52 raises non-singulated packaged semiconductor device 44 from test fixture 10 (indicated by arrows 54) and, if desired, another packaged semiconductor device 44 is placed on test fixture 10 and tested.

After testing, packaged semiconductor devices 44 are transported to tool sets 42 and 43, for lead "forming" and singulation, respectively. Thus, the singulated devices have been tested prior to being released from trim and form apparatus 40.

By now it should be appreciated that a method for testing packaged semiconductor devices has been provided. One advantage of the present invention is that the semiconductor devices are tested in the trim and form apparatus thereby reducing the number of times that the semiconductor devices must be handled; which in turn decreases the probability of damaging a packaged semiconductor device as well as decreases the cost of manufacturing packaged semiconductor devices.

Further, the use of malleable materials, such as "PALINEY", beryllium copper, and the like, for contactor leads 31 allows re-forming the contactor leads 31. In other words, the contactor leads 31 are of sufficient length and malleability to allow bending the leads to compensate for the length of the first end that becomes worn down by the abrasive wearing due to the testing of many semiconductor devices. Moreover, the length and malleability of contactor leads 31 allow leads 31 to "scrub" the leadframe such that a good electrical contact is made therebetween.

In addition, the length of the contactor leads 31 between the conductive traces on the loadboard and the bonding pads on the semiconductor device behave as a transmission line "stub". Since the contactor leads 31 contact the leadframe leads and the conductive traces 36 of the loadboard, the length of the transmission line "stub" is minimized. Hence, another advantage of the present invention is that the distance between the semiconductor die bonding pad and the loadboard is shortened, thereby mitigating any transmission line effects associated with high speed semiconductor device testing.

The present invention is not limited to plastic leaded chip carriers, but applies to other package types such as, for example, dual in-line packages and quad flat packages. Further, the number of leads is not a limitation of the present invention. In other words, test fixtures in accordance with the present invention may be manufactured to accommodate packages having more or less than 44 leads.

Although the present invention has been described for in-line testing of non-singulated packaged semiconductor devices in a trim and form apparatus, it shall be understood that test fixture 10 of the present invention is not limited to testing non-singulated packaged semiconductor devices, but may be used for testing packaged semiconductor devices excised from the leadframe, i.e., singulated packaged semiconductor devices.

I claim:

1. An adjustable test fixture for mating with leadframe leads, comprising:

an electrically nonconductive base, the electrically nonconductive base having at least one side wherein the at least one side has a recess extending into the electrically nonconductive base and terminating at a backwall;

a plurality of guidemembers extending from the backwall; and a detachable contactor assembly, the detachable contactor assembly having a top side and a bottom side and a plurality of leads which mate with the plurality of guidemembers, each lead having a first end and a second end wherein the first end projects from the top side and the second end projects from the bottom side.

2. An adjustable test fixture for mating with leadframe leads as claimed in claim 1 further including means for securing the detachable contactor assembly to the electrically nonconductive base.

3. An adjustable test fixture for mating with leadframe leads as claimed in claim 1, wherein the detachable contactor assembly is a molded structure having the plurality of leads molded therethrough.

4. An adjustable test fixture for mating with leadframe leads as claimed in claim 1, wherein the first ends of the plurality of leads are adapted to mate with a semiconductor device and the second ends of the plurality of leads are adapted to mate with a tester.

5. An adjustable test fixture for mating with leadframe leads as claimed in claim 1, wherein the electrically nonconductive base has four sides, each side having a recess extending into the electrically nonconductive base and terminating at a corresponding backwall.

6. An adjustable test fixture for mating with leadframe leads as claimed in claim 5 wherein the adjustable test fixture is adapted to mate with a plastic leaded chip carrier package.

7. An adjustable test fixture, comprising:

a base having a plurality of sides, wherein a first side of the plurality of sides has a recess having a mouth and a backwall;

a first plurality of cantilever structures extending from the backwall of the recess in the first side of the plurality of sides, wherein the cantilever structures of the first plurality of cantilever structures are spaced apart from each other;

a second plurality of cantilever structures extending from the backwall of the recess in the first side of the plurality of sides, and wherein the cantilever structures of the second plurality of cantilever structures are spaced apart from each other and each of the second plurality of cantilever structures is aligned with a corresponding cantilever structure of the first plurality of cantilever structures; and a first detachable contactor assembly for mating with the base, wherein the first detachable contactor assembly comprises a case having a top side, a bottom side, and at least one contactor lead having a first end extending from the top side and a second end projecting from the bottom side.

8. The adjustable test fixture of claim 7, wherein the first detachable contactor assembly comprises a molded case having the at least one contactor lead molded therein.

9. The adjustable test fixture of claim 7, wherein the at least one contactor lead comprises two contactor leads that are positioned side by side and abut one another.

10. The adjustable test fixture of claim 7, further including a first retainer for securing the first detachable contactor assembly to the base.

11. The adjustable test fixture of claim 7, wherein a second side of the plurality of sides has a recess having a mouth and a backwall, and further including:
   a third plurality of cantilever structures extending from the backwall of the recess in the second side of the plurality of sides, wherein the cantilever structures of the third plurality of cantilever structures are spaced apart from each other; and
   a fourth plurality of cantilever structures extending from the backwall of the recess in the second side of the plurality of sides, wherein the cantilever structures of the fourth plurality of cantilever structures are spaced apart from each other and each of the fourth plurality of cantilever structures is aligned with a corresponding cantilever structure of the third plurality of cantilever structures.

12. The adjustable test fixture of claim 11, further including a second detachable contactor assembly for mating with the base, wherein the second detachable contactor assembly comprises a case having a top side, a bottom side, and at least one contactor lead having a first end extending from the top side and a second end projecting from the bottom side.

13. The adjustable test fixture of claim 12, further including a second retainer for securing the second detachable contactor assembly to the base.

14. The adjustable test fixture of claim 11, wherein a third side of the plurality of sides has a recess having a mouth and a backwall, and further including:
   a fifth plurality of cantilever structures extending from the backwall of the recess in the third side of the plurality of sides, wherein the cantilever structures of the fifth plurality of cantilever structures are spaced apart from each other; and
   a sixth plurality of cantilever structures extending from the backwall of the recess in the third side of the plurality of sides, wherein the cantilever structures of the sixth plurality of cantilever structures are spaced apart from each other and each of the sixth plurality of cantilever structures is aligned with a corresponding cantilever structure of the fifth plurality of cantilever structures.

15. The adjustable test fixture of claim 14, further including a third detachable contactor assembly for mating with the base, wherein the third detachable contactor assembly comprises a case having a top side, a bottom side, and at least one contactor lead having a first end extending from the top side and a second end projecting from the bottom side.

16. The adjustable test fixture of claim 15, further including a third retainer for securing the third detachable contactor assembly to the base.

17. The adjustable test fixture of claim 14, wherein a fourth side of the plurality of sides has a recess having a mouth and a backwall, and further including:
   a seventh plurality of cantilever structures extending from the backwall of the recess in the fourth side of the plurality of sides, wherein the cantilever structures of the seventh plurality of cantilever structures are spaced apart from each other; and
   an eighth plurality of cantilever structures extending from the backwall of the recess in the fourth side of the plurality of sides, wherein the cantilever structures of the eighth plurality of cantilever structures are spaced apart from each other and each of the eighth plurality of cantilever structures is aligned with a corresponding cantilever structure of the seventh plurality of cantilever structures.

18. The adjustable test fixture of claim 17, further including a fourth detachable contactor assembly for mating with the base, wherein the fourth detachable contactor assembly comprises a case having a top side, a bottom side, and at least one contactor lead having a first end extending from the top side and a second end projecting from the bottom side.

19. The adjustable test fixture of claim 18, further including a fourth retainer for securing the fourth detachable contactor assembly to the base.

20. The adjustable test fixture of claim 10, further including retaining screws which cooperate with at least the first retainer to secure the first detachable contactor assembly to the base.

\* \* \* \* \*